United States Patent [19]

Torres et al.

[11] Patent Number: 5,075,251

[45] Date of Patent: Dec. 24, 1991

[54] TUNGSTEN SILICIDE SELF-ALIGNED FORMATION PROCESS

[75] Inventors: Joaquim Torres, Saint Martin le Vinoux; Jean Palleau, Uriage; Noureddine Bourhila, Echirolles, all of France

[73] Assignee: Etat Francais, Moulineaux, France

[21] Appl. No.: 404,529

[22] Filed: Sep. 8, 1989

[30] Foreign Application Priority Data

Sep. 9, 1988 [FR] France .................. 8812347

[51] Int. Cl.$^5$ ........................................... H01L 21/44
[52] U.S. Cl. .................... 437/200; 437/192; 437/198; 437/41; 148/DIG. 19; 148/DIG. 147
[58] Field of Search ............... 437/200, 190, 192, 196, 437/247, 983, 41; 148/DIG. 19, DIG. 147

[56] References Cited

U.S. PATENT DOCUMENTS

| | | | |
|---|---|---|---|
| 3,993,808 | 11/1976 | Inaba et al. | 437/230 |
| 4,425,700 | 1/1984 | Sasaki et al. | 437/200 |
| 4,622,735 | 11/1986 | Shibata | 437/200 |
| 4,716,131 | 12/1987 | Okazawa et al. | 437/200 |
| 4,746,219 | 5/1988 | Holloway et al. | 437/40 |
| 4,847,111 | 7/1989 | Chow et al. | 437/200 |
| 4,962,414 | 10/1990 | Liou et al. | 437/189 |

FOREIGN PATENT DOCUMENTS 0264692  4/1988  European Pat. Off. .
126631   6/1987  Japan .
200717   9/1987  Japan .

OTHER PUBLICATIONS

Moss, S. J. et al., The Chemistry of the Semiconductor Industry, p. 260, Chapman and Hall, New York.
Essderc 88, Journal de Physique, Colloque C4, Supplement au n°9, Sep. 1988 (cover pages).
Wolf et al., "Silicon Processing for the VLSI Era" vol. 1, 1986.
"Control of a Self-Aligned W Silicide Process by Annealing Ambience"; Torres et al., Journal de Physignal Collogne, Sep. 1988; vol. 49; No. C-4; pp. 183-186.
"The High-Temperature Stability . . . Ammonia and Argon"; Journal of Applied Physics (15 Dec. 1988); vol. 64; No. 12; pp. 6721-6726.

Primary Examiner—Brian E. Hearn
Assistant Examiner—Trung Dang
Attorney, Agent, or Firm—Lowe, Price, Leblanc and Becker

[57] ABSTRACT

A process for forming tungsten or molybdenum silicide on silicon apparent regions (6) of a silicon wafer surface (1) also comprising oxidized regions (2) includes the steps consisting in uniformly coating the wafer with a tungsten or molybdenum layer (10) and annealing at a temperature ranging from 700° C. to 1000° C. The annealing step is carried out in presence of a low pressure gas forming a chemical composite with tungsten or molybdenum. The composite is then selectively etched.

3 Claims, 1 Drawing Sheet

TUNGSTEN SILICIDE SELF-ALIGNED FORMATION PROCESS

BACKGROUND OF THE INVENTION

In some prior art techniques for manufacturing integrated circuits, it is desired to transform the apparent silicon surfaces into a refractory metal silicide; for example, in case of MOS transistors, it may be desirable to carry out this operation on the surface of the polycrystalline silicon gate areas and on the surfaces of the drain and source areas which are doped areas in a monocrystalline silicon substrate.

A conventional process for realizing this operation will be described herebelow in relation with FIGS. 1-4 in case the refractory metal is tungsten.

FIG. 1 shows a schematical section view of a MOS transistor structure at an intermediate manufacturing stage. The structure of FIG. 1 is formed in a silicon subtrate 1, in an area delineated by thick oxide regions 2.

The MOS transistor comprises a polycrystalline silicon gate 3 formed on a gate oxide layer 4. The gate edges are isolated by an oxide layer usually called a spacer 5. The drain 6 and the source 7 exhibit in FIG. 1 a stepped structure because they are formed in two steps; a first step in which the thick oxide region and the gate itself serve as a mask and a second step in which it is the gate, enlarged by the spacers, that serves as a mask.

If, at this manufacturing stage, a tungsten silicide layer is to be formed at the surface of the gate, and at the surface of the source and drain, a tungsten layer 10 is uniformly deposited (FIG. 2) for example through cathodic sputtering. A thermal process ranging from 700° C. to 1000° C. is then carried out; as a result, tungsten reacts with the apparent silicon surfaces for forming a tungsten silicide $WSi_2$, referenced 11 in FIG. 3. This thermal process is made under vacuum conditions or in an atmosphere neutral with respect to tungsten.

Following that step, as shown by FIG. 4, the tungsten layer is eliminated by means of selective etching.

This conventional process is advantageous in that only simple steps are involved, namely a uniform metal deposition, and no lithographic step is necessary for positioning tungsten silicide.

However, this process is inefficient in case of very small size structures (minimum dimension lower than one micrometer). Indeed, the extension, and more particularly the lateral extension, of the $WSi_2$ regions depends upon the annealing time that has to be controlled with the greatest accuracy. Moreover, the presence of small native oxide areas on the theoretically bared silicon areas causes an inhomogeneous thickness of the tungsten silicide layer, since tungsten does not react with $SiO_2$, and, if the reaction is continued for palliating this difficulty, the lateral extension of the tungsten silicide is unduly increased.

The same problems are encountered with molybdenum. They have been partially solved as far as titanium is concerned by causing titanium to react with nitrogen under atmospheric pressure conditions during the annealing process. This process leads to an equilibrium stage between the formation of titanium nitride and titanium silicide and therefore permits to obtain a well defined reaction final state. However, this process has not been envisaged for molybdenum and tungsten which do not react with $N_2$ at the annealing temperatures. Moreover, in case of tungsten, the process, implemented under ambient pressure conditions, supplies too thin silicide layers.

SUMMARY OF THE INVENTION

One object of the invention is to provide for a localized formation process of tungsten or molybdenum silicide which exhibits the same advantage as far as simplicity is concerned as the prior art process hereinabove described in relation with FIGS. 1-4 while avoiding its drawbacks.

In order to achieve this object, the invention provides for a localized formation process of tungsten silicide or molybdenum on the silicon apparent regions of a silicon wafer surface also including oxidized regions, comprising the steps consisting in uniformly coating the wafer with a tungsten or molybdenum layer and in annealing at an appropriate temperature; according to this process, the annealing step is carried out in presence of a reactive gas such as oxygen or a nitrogen composite such as $NH_3$. The annealing process is made under reduced pressure of the reactive gas. If it is desired to proceed under atmospheric pressure conditions, the reactive gas is diluted in a neutral carrier gas.

BRIEF DISCLOSURE OF THE DRAWINGS

The foregoing and other objects, features and advantages of the invention will be explained in relation with FIGS. 1-4 while explaining the state of the art.

DETAILED DESCRIPTION OF THE INVENTION

Figure 1:
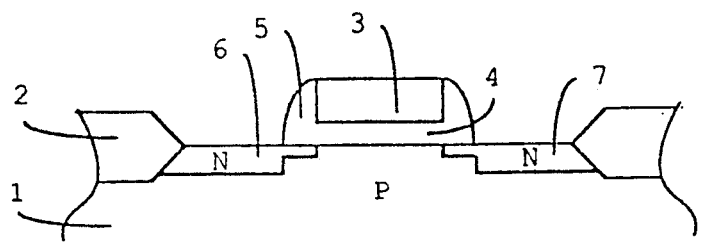
Figure 2:
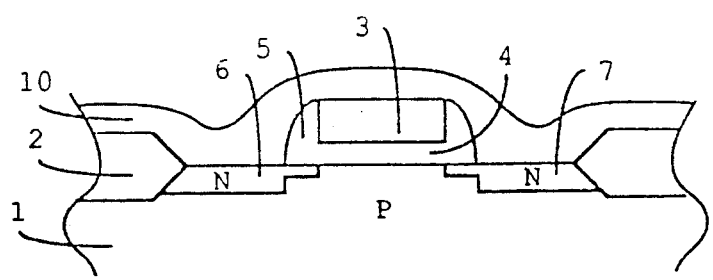
Figure 3:
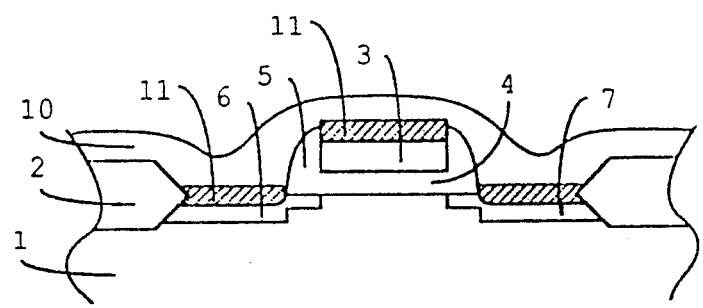

According to the invention, the steps leading to the structure illustrated in FIG. 2 are first implemented. However, according to the invention, instead of carrying out the annealing process under a vacuum or a neutral atmosphere, this annealing process is made in presence of an atmosphere containing a gas liable to react with tungsten such as oxygen or a nitrogen composite, such as $NH_3$, decomposing within the appropriate temperature range for forming atomic nitrogen. Thus, during the annealing process, while tungsten reacts with silicon for forming the layers 11 illustrated in FIG. 3, tungsten is combined with oxygen or nitrogen for forming a $WO_x$ or $WN_x$ composite.

One major advantage of the invention is that, once the tungsten layer has been completely transformed, on the one hand into $WSi_2$, and on the other into $WO_x$ or $WN_x$, an equilibrium state is reached which does not change any longer even if the annealing process is continued.

Generally, the formation of a $WN_x$ ($WO_x$) composite is much faster than the formation of $WSi_2$. For example, if it is proceeded under ambient pressure conditions with pure oxygen or pure $NH_3$, substantially the whole thickness of the tungsten layer will be transformed into $WO_x$ (or $WN_x$). To obtain a predetermined thickness of $WSi_2$, the reaction of W with the annealing atmosphere gas ($O_2$ or $NH_3$) is slowed down, either by reducing the gas pressure in the annealing chamber, or by diluting the gas reacting with tungsten in a neutral gas if it is preferred to operate under atmospheric pressure. In practical embodiments, it is necessary to select partial pressures lower than one torr ($10^2$ pascals). The adjustment of this partial pressure, which is one of the aspects of the invention, permits to determine the thickness of the tungsten silicide layer that is to be obtained. This is also true as regards molybdenum as well as titanium.

Figure 4:
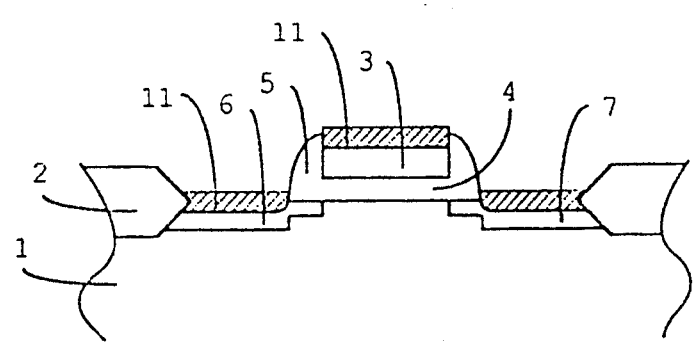

For the final step illustrated in FIG. 4, it is possible to choose any product selectively etching $WN_x$ or $WO_x$ with respect to $SiO_2$, Si and $WSi_2$. A satisfactory product is for example potassium ferricyanide.

The invention is liable of numerous variants, especially as regards the gas permitting to generate a composite with tungsten or molybdenum. This may be a gas comprising oxygen such as pure oxygen or air, or a gas comprising nitrogen such as $NH_3$. The examples of the invention more particularly relate to tungsten but the invention applies in the same way to molybdenum.

We claim:

1. A process of forming self-aligned metal silicide on silicon apparent regions of a silicon wafer surface having oxidized regions comprising:

uniformly coating said surface of said wafer with a metal selected from the group consisting of tungsten and molybdenum;

annealing said metal coating in the presence of a reactive gas having a partial pressure lower than $10^2$ pascals and selected from the group consisting of oxygen, $NH_3$, and mixtures thereof at a temperature in the range of from 700° C. to 1000° C. to form a corresponding metal silicide at said silicon apparent regions; and subsequently removing, by an etching process, material formed on said oxidized surface regions of said silicon wafer and said metal coating, which material is a reaction product of said metal and said reactive gas which is formed during said annealing step.

2. A process according to claim 1 wherein the annealing process is carried out under atmospheric pressure conditions and said reactive gas is diluted in a neutral carrier gas.

3. A process according to claim 1 wherein said material formed on said oxidized surface regions of said silicon wafer and said metal coating comprises a nitride or oxide of said metal.

* * * * *